(12) United States Patent
Kang et al.

(10) Patent No.: US 9,685,215 B1
(45) Date of Patent: Jun. 20, 2017

(54) SEMICONDUCTOR MEMORY DEVICE INCLUDING A FERROELECTRIC LAYER

(71) Applicant: SK hynix Inc., Gyeonggi-do (KR)

(72) Inventors: Se Hun Kang, Gyeonggi-do (KR); Deok Sin Kil, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/246,081

(22) Filed: Aug. 24, 2016

(30) Foreign Application Priority Data

Apr. 1, 2016 (KR) .................. 10-2016-0039927

(51) Int. Cl.
| | |
|---|---|
| *G11C 11/22* | (2006.01) |
| *H01L 27/1159* | (2017.01) |
| *H01L 29/78* | (2006.01) |
| *H01L 29/08* | (2006.01) |
| *H01L 29/06* | (2006.01) |
| *H01L 29/51* | (2006.01) |
| *H01L 43/00* | (2006.01) |
| *H01L 43/08* | (2006.01) |

(52) U.S. Cl.
CPC ............ *G11C 11/223* (2013.01); *G11C 11/22* (2013.01); *G11C 11/221* (2013.01); *H01L 27/1159* (2013.01); *H01L 29/0649* (2013.01); *H01L 29/0684* (2013.01); *H01L 29/0847* (2013.01); *H01L 29/513* (2013.01); *H01L 29/516* (2013.01); *H01L 29/517* (2013.01); *H01L 29/7827* (2013.01); *H01L 29/78391* (2014.09); *H01L 43/00* (2013.01); *H01L 43/08* (2013.01)

(58) Field of Classification Search
CPC ..... G11C 11/22; G11C 11/221; G11C 11/223; H01L 43/08
See application file for complete search history.

(56) References Cited

U.S. PATENT DOCUMENTS

| | | | |
|---|---|---|---|
| 9,196,655 B2* | 11/2015 | Park ................... | H01L 27/2454 |
| 2003/0076707 A1* | 4/2003 | Kim ...................... | B82Y 10/00 |
| | | | 365/158 |
| 2010/0110753 A1* | 5/2010 | Slesazeck .............. | G11C 5/063 |
| | | | 365/145 |
| 2011/0188288 A1* | 8/2011 | Minami .................. | G11C 11/22 |
| | | | 365/145 |
| 2015/0070964 A1 | 3/2015 | Yamada et al. | |
| 2015/0310905 A1* | 10/2015 | Karda ................... | G11C 11/223 |
| | | | 365/185.03 |

\* cited by examiner

*Primary Examiner* — Eduardo A Rodela
(74) *Attorney, Agent, or Firm* — IP & T Group LLP

(57) ABSTRACT

A semiconductor memory device may include a pillar, a gate and at least one ferroelectric layer. The pillar may include a source, a drain and a channel region. The drain may be arranged over the source. The channel region may be arranged between the source and the drain. The gate may be formed on an outer surface of the pillar. The ferroelectric layer may be interposed between the pillar and the gate.

19 Claims, 9 Drawing Sheets

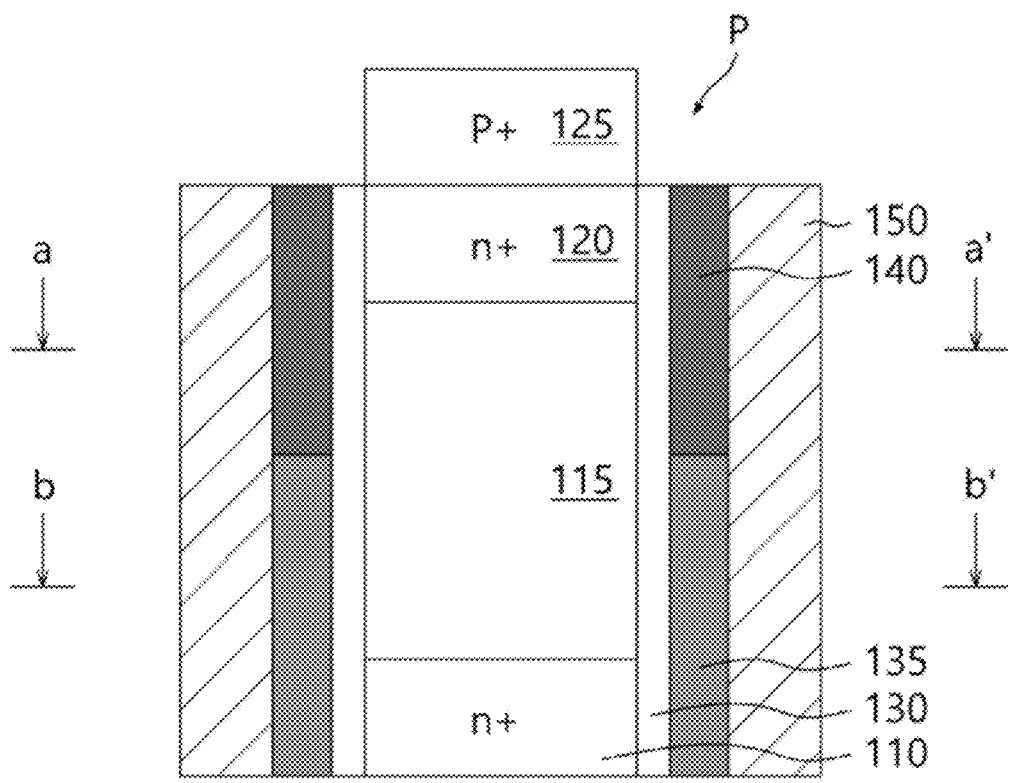

SEMICONDUCTOR MEMORY DEVICE INCLUDING A FERROELECTRIC LAYER

CROSS-REFERENCES TO RELATED APPLICATION

The present application claims priority under 35 U.S.C. §119(a) to Korean application number 10-2016-0039927, filed on Apr. 1, 2016, which is incorporated herein by reference in its entirety.

BACKGROUND

1. Technical Field

Various embodiments generally relate to a semiconductor memory device, more particularly, to a tunnel FET device and a method of manufacturing the tunnel FET device.

2. Related Art

Generally, a resistive memory device may include a resistive element changed in accordance with operations of a switching element. The resistive memory device may store data of "0" or "1" in accordance with resistance states of the resistive element to perform memory operations.

In order to improve an integration degree of the resistive memory device, the resistive memory device may have a three-dimensional structure. The three-dimensional resistive memory device may include a switching element having a vertical pillar shape. Currently, to improve operational capacity of the switching element, the switching element may include a tunnel field effect transistor (FET) structure.

SUMMARY

According to an embodiment, there may be provided a semiconductor memory device. The semiconductor memory device may include a pillar, a gate and at least one ferroelectric layer. The pillar may include a source, a drain and a channel region. The drain may be arranged over the source. The channel region may be arranged between the source and the drain. The gate may be formed on an outer surface of the pillar. The ferroelectric layer may be interposed between the pillar and the gate.

According to an embodiment, there may be provided a semiconductor memory device. The semiconductor memory device may include a pillar, a storage medium and a gate. The pillar may include a channel region, a source and a drain. The channel region may be extended in a direction substantially perpendicular to a semiconductor substrate. The source may be arranged under the channel region. The drain may be arranged over the channel region. The storage medium may be arranged on an outer surface of the pillar. The gate may be formed on an outer surface of the storage medium. The storage medium may include a plurality of ferroelectric layers configured to be individually polarized by different electric fields.

In exemplary embodiments, the ferroelectric layers may include different materials.

In exemplary embodiments, the ferroelectric layers may include substantially the same material having different composition ratios.

In exemplary embodiments, the ferroelectric layers of the storage medium may have a stack shape.

In exemplary embodiments, the semiconductor memory device may further include an insulating layer between the semiconductor substrate and the storage medium to improve insulating characteristics. The insulating layer may include a silicon oxide layer.

In exemplary embodiments, the source of the pillar may have a first impurity type. The drain and the channel region may have a second impurity type opposite to the first impurity type. The semiconductor memory device may further include a junction inducement region having the first impurity type between the channel region and the drain.

In exemplary embodiments, the gate and the storage medium may be configured to surround the outer surface of the pillar. The gate and the storage medium may be formed on both sidewalls of the pillar.

BRIEF DESCRIPTION OF THE DRAWINGS

FIG. 10 is a cross-sectional view illustrating a semiconductor memory device including a tunnel FET in accordance with exemplary embodiments;

DETAILED DESCRIPTION

Figure 1:
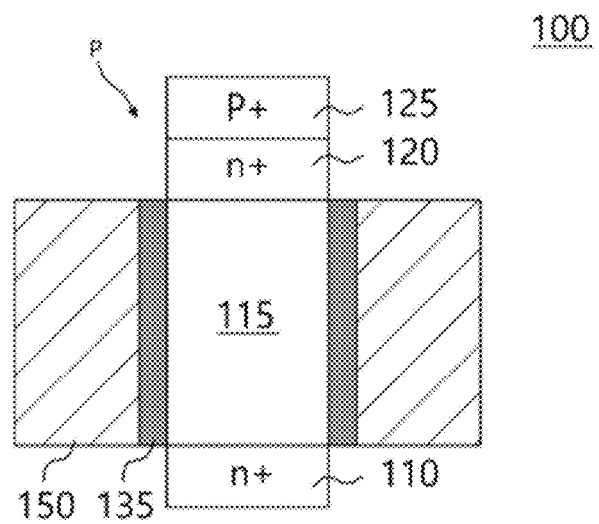
FIG. 1 is a cross-sectional view illustrating a semiconductor memory device including a tunnel FET in accordance with exemplary embodiments.

Various exemplary embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented for example, rotated 90 degrees or at other orientations, and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be described with reference to the accompanying drawings.

FIG. 1 is a cross-sectional view illustrating a semiconductor memory device including a tunnel FET in accordance with exemplary embodiments.

A tunnel FET of this exemplary embodiment may include a ferroelectric layer having polarization characteristics substantially similar to a gate insulating layer so as to provide the tunnel FET with a high Integration degree and an on-current characteristic. The tunnel FET may have a vertical channel shape to improve an integration density.

Referring to FIG. 1, the tunnel FET 100 may include a pillar P formed on an upper surface of a semiconductor substrate (not shown). The pillar P may be extended in a direction substantially perpendicular to the upper surface of the semiconductor substrate. The pillar P may include a source 110 and a drain 125. To form the tunnel FET, the source 110 may include an n type impurity region n$^+$ having a high concentration. The drain 125 may include a p type impurity region p$^+$ having a high concentration. A channel region 115 may be formed between the source 110 and the drain 125. The channel region 115 may include a p type impurity region. A junction inducement region 120 may be formed between the drain 125 and the channel region 115. The junction inducement region 120 may include an n type impurity region n$^+$ having a high concentration so that PN junctions may be formed between the junction inducement region 120 and the channel region 115, and between the junction inducement region 120 and the drain 125.

A gate insulating layer may be formed on an outer surface of the pillar P. The gate insulating layer may include a ferroelectric layer 135. The ferroelectric layer 135 may include a dielectric material having a characteristic of switchable polarizations by an external electric field. The external electric field may be generated by a voltage between the gate and the drain 135 or the source. The ferroelectric layer 135 may include a metal oxide layer having ferroelectrics. For example, the ferroelectric layer 135 may include a hafnium oxide ($Hf_xO_y$) layer, a zirconium oxide layer ($Zr_xO_y$), a hafnium-zirconium ($Hf_xZr_yO_z$) layer, etc. Alternatively, the ferroelectric layer 135 may include lead zirconate titanate PZT [$Pb(Zr_xTi_{1-x})O_3$, $0 \leq x \leq 1$], or SBT ($SrBi_2Ta_2O_9$).

Although not depicted in drawings, an insulating layer such as a silicon oxide layer may be formed between the pillar P and the ferroelectric layer 135.

A gate 150 may be formed on an outer surface of the pillar P. The gate 150 may include a metal layer, a metallic compound layer, a conductive polysilicon layer, etc. The gate 150 may be formed to correspond to the pillar P and the channel region 115. The gate 150 may be selectively connected with a word line.

An on-current characteristic of the tunnel FET may be improved by using the ferroelectric layer 135 as the gate insulating layer. That is, a current transmission capacity of the tunnel FET may be remarkably improved by a residual polarization of the ferroelectric layer 135.

Further, the semiconductor memory device may have improved integration density by the channel region 115 of the tunnel FET extending in the direction substantially perpendicular to the upper surface of the semiconductor substrate.

Furthermore, the ferroelectric layer 135 may include variable resistances by the polarization characteristic. Thus, the polarization characteristic of the ferroelectric layer 135 may be controlled by applying the electric field to the gate 150 so that the ferroelectric layer 135 may be used as a storage medium without a capacitor. Therefore, the tunnel FET of this exemplary embodiment may operate as a switching element and a storing element with a 1-transistor memory.

In exemplary embodiments, the source 110 in FIG. 1 may have a pattern shape. Alternatively, the source 110 may have a linear shape configured to be driven as a common source.

Alternatively, the ferroelectric layer 120 may include other dielectric materials capable of being polarized by the electric field applied to an electrode, for example, a gate.

FIGS. 2 to 7 are cross-sectional views of a semiconductor memory device including a tunnel FET for illustrating a method of manufacturing a semiconductor memory device including a tunnel FET in accordance with exemplary embodiments.

Figure 2:
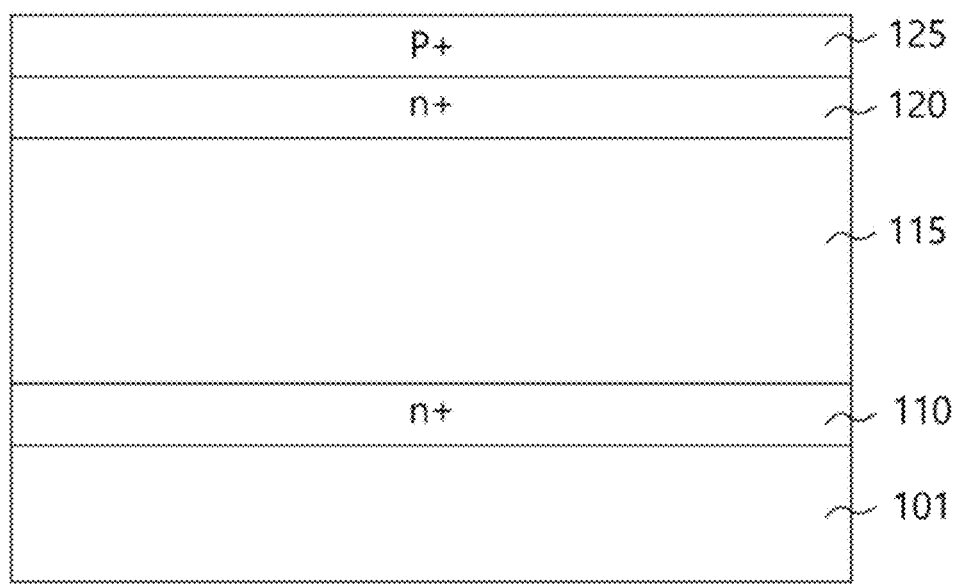
FIGS. 2 to 7 are cross-sectional views of a semiconductor memory device including a tunnel FET for illustrating a method for manufacturing the same in accordance with exemplary embodiments.

Referring to FIG. 2, a semiconductor substrate 101 may be prepared. The semiconductor substrate 101 may include a p type silicon substrate. A first n type impurity region having a high concentration may be formed in the semiconductor substrate 101 by a deep implantation process to define the source 110. N type impurities may be implanted into a region of the semiconductor substrate, in which the channel region 115 is to be formed, to form a second n type impurity region having a high concentration, that is, the junction inducement region 120. P type impurities may be implanted into a region of the semiconductor substrate 101 over the junction inducement region 120 to form a p type impurity region, that is, the drain 125. Alternatively, a source layer, a junction inducement layer and a drain layer may be sequentially stacked to form the source 110, the junction inducement region 120 and the drain 125.

Figure 3:
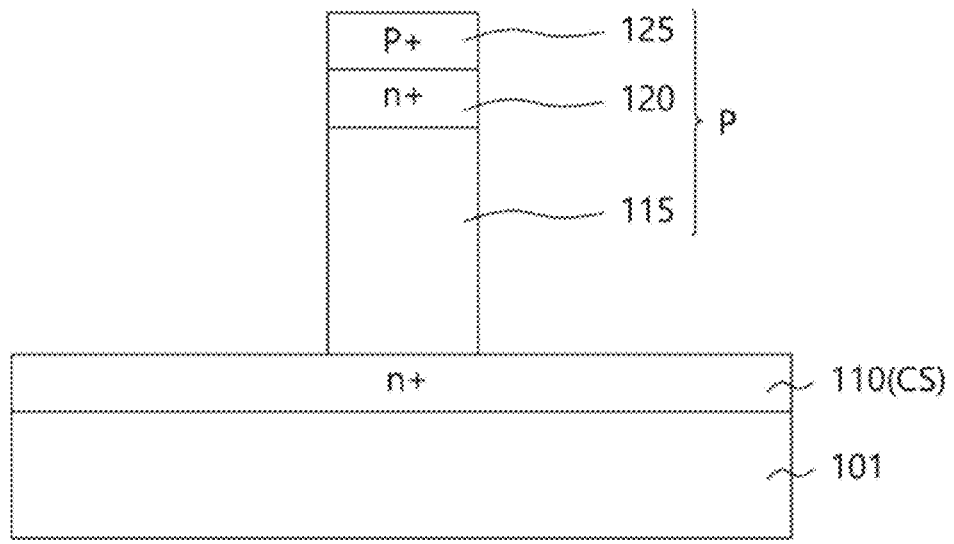

Referring to FIG. 3, the source 110, the region of the semiconductor substrate where the channel region 115 is to be formed, the junction inducement region 120 and the drain 125 may be patterned to form a pillar P. When the n type impurity region having the high concentration is patterned to form the pillar P, Individual source shapes may be formed. When the first n type impurity region having the high concentration is not patterned, a common source CS may be formed.

Figure 4:
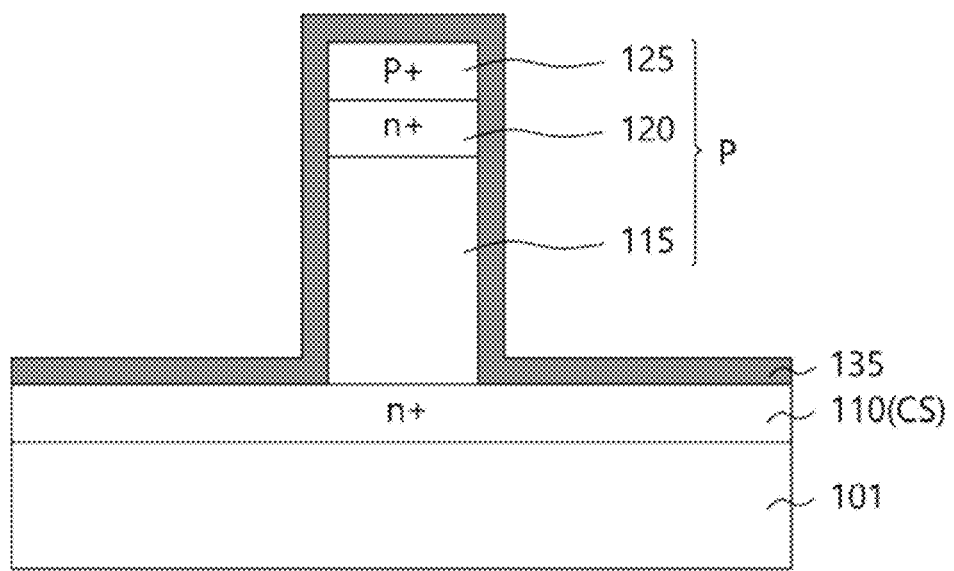

Referring to FIG. 4, a ferroelectric layer 135 may be formed on the semiconductor substrate 101 having the pillar P. The ferroelectric layer 135 may be formed by an atomic layer deposition (ALD) process, a chemical vapor deposition (CVD) process, etc. The ferroelectric layer 135 may include a hafnium oxide ($Hf_xO_y$) layer, a zirconium oxide layer ($Zr_xO_y$), a hafnium-zirconium ($Hf_xZr_yO_z$) layer, etc. Alternatively, the ferroelectric layer 135 may include PZT [$Pb(Zr_xTi_{1-x})O_3$, $0 \leq x \leq 1$, or SBT ($SrBi_2Ta_2O_9$).

Figure 5:
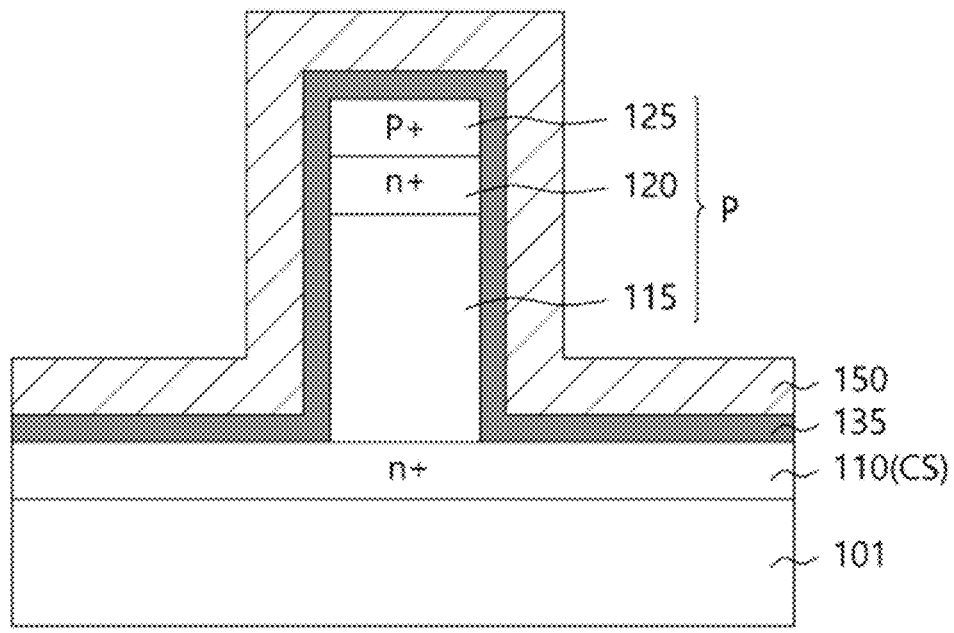

Referring to FIG. 5, a conductive layer 150 may be formed on the ferroelectric layer 135. The conductive layer 150 may include a metal layer, a metallic compound layer, a conductive polysilicon layer, etc. For example, the conductive layer 150 may include TiN.

Figure 6:
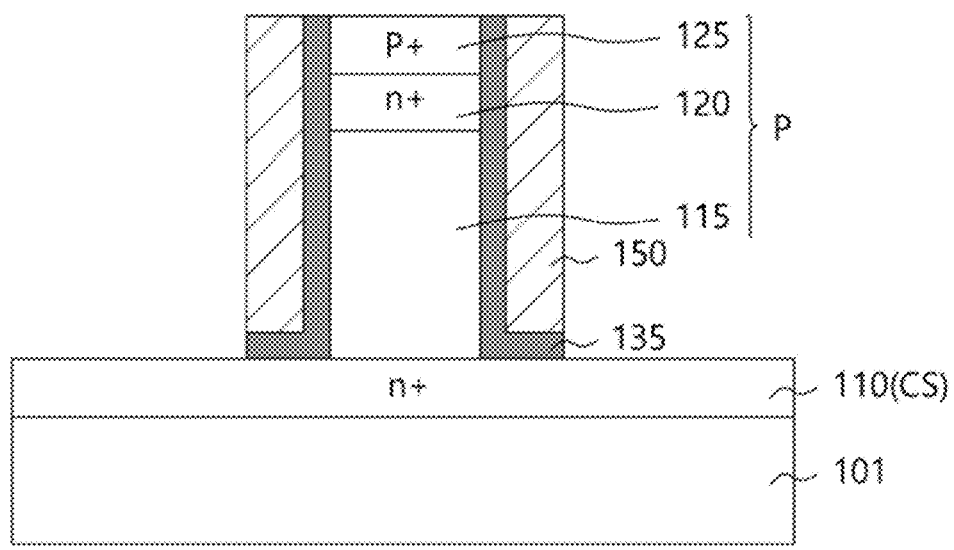

Referring to FIG. 6, the conductive layer 150 and the ferroelectric layer 135 may be anisotropically etched until upper surfaces of the drain 125 and/or the source 110 may be exposed.

Figure 7:
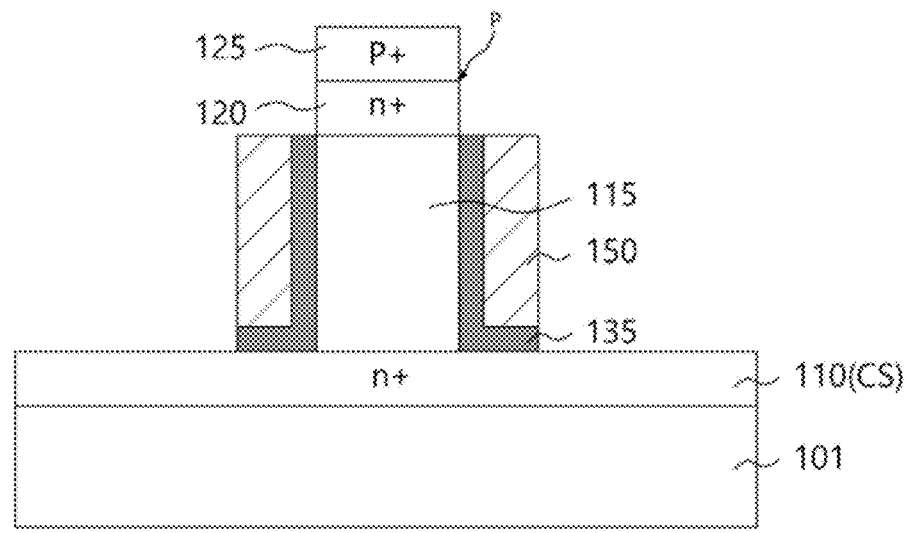

Referring to FIG. 7, the conductive layer 150 and the ferroelectric layer 135 may be partially removed to define the gate and the gate insulating layer. The remaining conductive layer 150 and ferroelectric layer 135 may have a thickness substantially the same as a height of the channel region 115.

Figure 8:
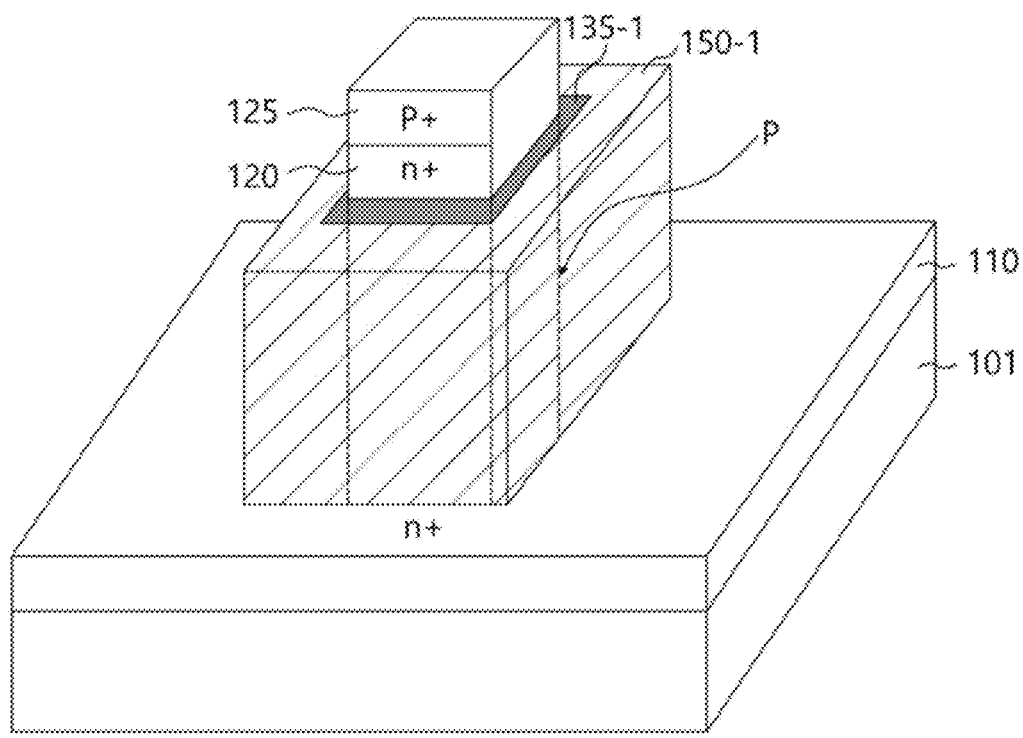
FIG. 8 is a perspective view illustrating a tunnel FET in accordance with exemplary embodiments.
Figure 9:
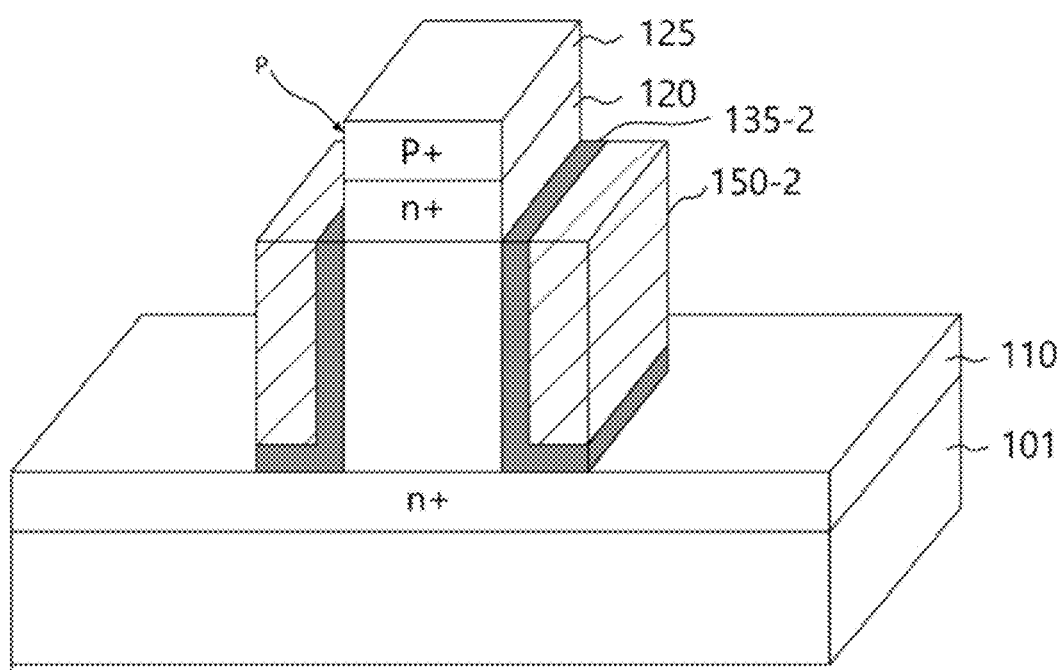
FIG. 9 is a perspective view illustrating a tunnel FET in accordance with exemplary embodiments.

The ferroelectric layer 135-1 and the gate 150-1 as shown in FIG. 8 may be configured to surround the pillar P. Further, the ferroelectric layer 135-2 and the gate 150-2 as shown in FIG. 9 may be formed on both sidewalls of the pillar P.

FIG. 10 is a cross-sectional view illustrating a semiconductor memory device including a tunnel FET in accordance with exemplary embodiments.

Referring to FIG. 10, a semiconductor memory device of this exemplary embodiment may include a first ferroelectric layer 135 and a second ferroelectric layer 140 as a gate insulating layer between a pillar P and a gate 150.

For example, the first ferroelectric layer 135 may be formed to correspond to a lower region of the pillar P. Particularly, the first ferroelectric layer 135 may be formed to correspond to a portion of the source 110 and a portion of the channel region 115. The first ferroelectric layer 135 may include a dielectric material having a characteristic of switchable polarizations by an external electric field. The first ferroelectric layer 135 may be formed by an atomic layer deposition (ALD) process, a chemical vapor deposition (CVD) process, etc. The first ferroelectric layer 135 may include a hafnium oxide ($Hf_xO_y$) layer, a zirconium oxide layer ($Zr_xO_y$), a hafnium-zirconium ($Hf_xZr_yO_z$) layer, etc. Alternatively, the ferroelectric layer 135 may include PZT [$Pb(Zr_xTi_{1-x})O_3$, $0 \leq x \leq 1$, or SBT ($SrBi_2Ta_2O_9$).

The second ferroelectric layer 140 may be arranged on the first ferroelectric layer 135. The second ferroelectric layer 140 may be formed to correspond to an upper region of the pillar P. The second ferroelectric layer 140 may be formed by an atomic layer deposition (ALD) process, a chemical vapor deposition (CVD) process, etc. Further, the second ferroelectric layer 140 may be formed by partially removing the first ferroelectric layer 135 formed as shown in FIG. 6 to form a recess, and filling the recess with a ferroelectric material. For example, the second ferroelectric layer 140 may be formed on an outer surface of a portion of the channel region 115 and the junction inducement region 120. The second ferroelectric layer 140 may include a dielectric material with a characteristic of switchable polarizations by an external electric field different from the external electric field applied to the first ferroelectric layer 135. The second ferroelectric layer 140 may include the ferroelectric material different from that of the first ferroelectric layer 135. Alternatively, the first and second ferroelectric layers 135 and 140 may include substantially the same material having different composition ratios.

The first and second ferroelectric layers 135 and 140 may be used as the gate insulating layer of the tunnel FET. Additionally, an insulating layer 130 may be interposed between the first and second ferroelectric layers 135 and 140 and the pillar P. The insulating layer 140 may include a silicon oxide layer.

Figure 11A:
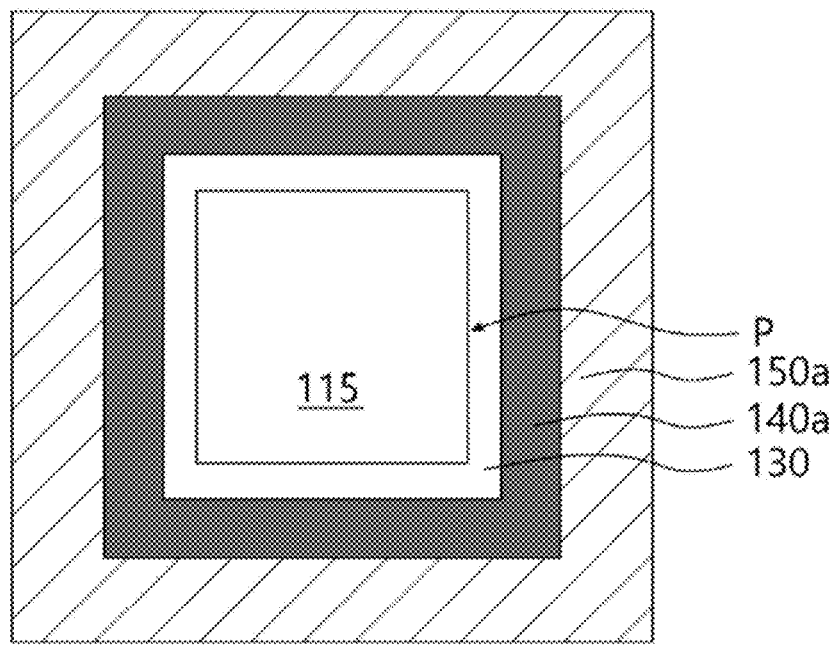
FIG. 11A is a cross-sectional view taken along a line a-a' in FIG. 10.
Figure 11B:
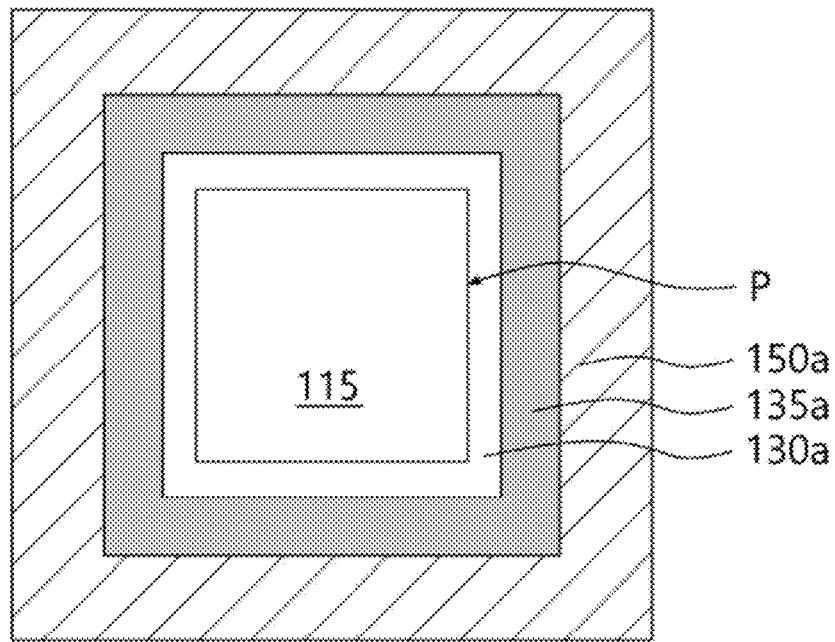
FIG. 11B is a cross-sectional view taken along a line b-b' in FIG. 10.

FIG. 11A is a cross-sectional view taken along a line a-a' in FIG. 10, and FIG. 11B is a cross-sectional view taken along a line b-b' in FIG. 10.

Referring to FIGS. 11A and 11B, a gate 150a, a first ferroelectric layer 135a and a second ferroelectric layer 140a may be configured to surround an entire side surface of the pillar P.

The first and second ferroelectric layers 135a and 140a may be formed by forming the first ferroelectric layer 135a and the gate 150a, etching the first ferroelectric layer 135a and the gate 150a to surround the pillar P, partially removing the first ferroelectric layer 135a to form a recess, and forming the second ferroelectric layer 140a in the recess. The second ferroelectric layer 140 may have an etching selectivity different from that of the first ferroelectric layer 135a.

Alternatively, the first and second ferroelectric layers 135a and 140a may be formed by forming the first ferroelectric layer 135a on the pillar P, masking a portion of the first ferroelectric layer 135a configured to surround the lower region of the pillar P with a mask pattern, and implanting impurities into the first ferroelectric layer 135a to form the second ferroelectric layer 140a.

Figure 12A:
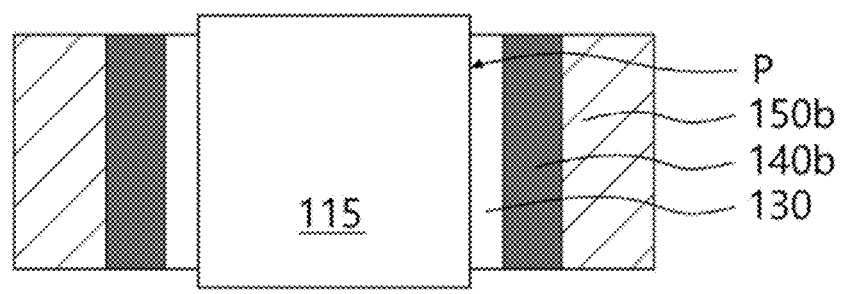
FIG. 12A is a cross-sectional view taken along a line a-a' in FIG. 10.
Figure 12B:
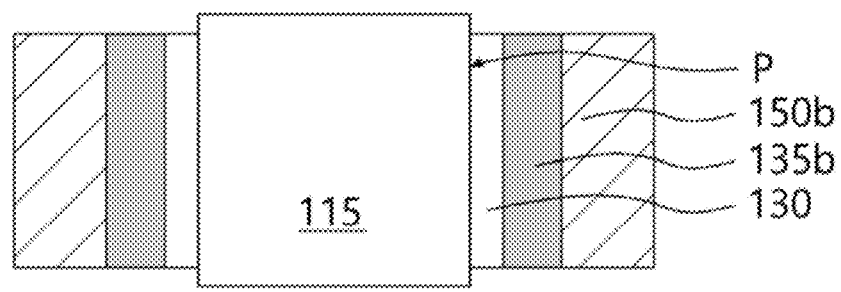
FIG. 12B is a cross-sectional view taken along a line b-b' in FIG. 10.

FIG. 12A is a cross-sectional view taken along a line a-a' in FIG. 10, and FIG. 12B is a cross-sectional view taken along a line b-b' in FIG. 10.

Referring to FIGS. 12A and 12B, a gate 150b, a first ferroelectric layer 135b and a second ferroelectric layer 140b may be formed on both sidewalls of the pillar P.

The first ferroelectric layer 135b, the second ferroelectric layer 140b and the gate 150b may be formed by an anisotropic etching process.

According to exemplary embodiments, the first and second ferroelectric layers 135 and 140 may be polarized selectively or simultaneously by an electric field generated by a voltage between the gate 150 and the drain 125 or the source. The electric field may be changed by a gate voltage or a drain voltage to obtain various resistance levels.

Figure 13:
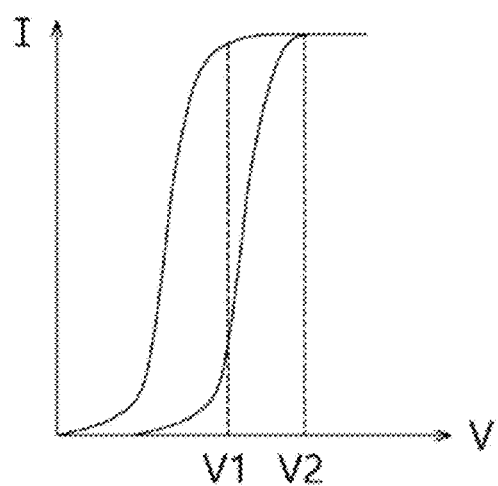
FIG. 13 is a graph showing current-voltage characteristics of a semiconductor memory device in accordance with exemplary embodiments.

For example, when the first and second ferroelectric layers 135 and 140 having different properties may be used in the ferroelectric memory device, as shown in FIG. 13, the two ferroelectric layers 135 and 140 may be polarized at different critical voltages V1 and V2. Thus, the various resistance levels may be obtained from an insulating state (0,0), a polarization (0,1) of the first ferroelectric layer, a polarization (1,0) of the second ferroelectric layer and polarizations (1,1) of the first and second ferroelectric layers (1,1).

In exemplary embodiments, the first and second ferroelectric layers may be used as the gate insulating layer and the storage medium of the vertical pillar type tunnel FET. Thus, the tunnel FET may have improved switching characteristics. Further, a multi-level may be obtained by polarizing the first and second ferroelectric layers at the different electric fields.

Figure 14:
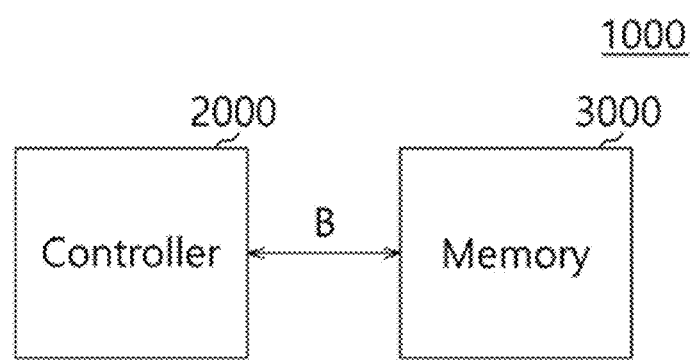
FIG. 14 is a block diagram illustrating a memory system in accordance with exemplary embodiments.

FIG. 14 is a block diagram illustrating a memory system in accordance with exemplary embodiments.

Referring to FIG. 14, a memory system 1000 may include a memory controller 2000 and a memory 3000. The memory 3000 may communicate with the memory controller 2000 through a bus line B. The bus line B may correspond to a bus for transmitting addresses, data and commands.

The memory 3000 may include the ferroelectric memory device of the exemplary embodiments. The ferroelectric memory device may have the tunnel FET structure including the vertical channel. The tunnel FET may include the at least one ferroelectric layer as the gate insulating layer. Therefore, the tunnel FET may be stably operated.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor memory device comprising:
   a pillar including a source, a drain arranged over the source and a channel region between the source and the drain;
   a gate arranged on an outer surface of the pillar; and
   at least one ferroelectric layer interposed between the pillar and the gate,
   wherein the source has an impurity type opposite to that of the drain.

2. The semiconductor memory device of claim 1, wherein the source comprises an n type impurity region having a high concentration, and the drain comprises a p type impurity region having a high concentration.

3. The semiconductor memory device of claim 2, wherein the channel region comprises p type impurities.

4. The semiconductor memory device of claim 3, further comprising a junction inducement region including n type impurities between the drain and the channel region.

5. The semiconductor memory device of claim 1, wherein the ferroelectric layer comprises a hafnium oxide ($Hf_xO_y$) layer, a zirconium oxide layer ($Zr_xO_y$), a hafnium-zirconium ($Hf_xZr_yO_z$) layer, PZT [$Pb(Zr_xTi_{1-x})O_3$, $0 \leq x \leq 1$], or SBT ($SrBi_2Ta_2O_9$).

6. The semiconductor memory device of claim 1, wherein the ferroelectric layer comprises:
   a first ferroelectric layer polarized by a first electric field; and
   a second ferroelectric layer polarized by a second electric field different from the first ferroelectric field.

7. The semiconductor memory device of claim 6, wherein the first ferroelectric layer comprises a material different from that of the second ferroelectric layer.

8. The semiconductor memory device of claim 6, wherein the first and second ferroelectric layers comprise a substantially same type of a material having different composition ratios.

9. The semiconductor memory device of claim 6, wherein the second ferroelectric layer is positioned over the first ferroelectric layer.

10. The semiconductor memory device of claim 1, further comprising a silicon oxide layer between the pillar and the ferroelectric layer.

11. The semiconductor memory device of claim 1, wherein the gate and the ferroelectric layer are configured to surround an entire outer surface of the pillar by one continuous gate electrode and one continuous storage film.

12. The semiconductor memory device of claim 1, wherein the gate and the ferroelectric layer are formed on both sidewalls of the pillar.

13. A semiconductor memory device comprising:
   a pillar including a channel region extending in a direction substantially perpendicular to an upper surface of a semiconductor substrate, a source arranged under the channel region and a drain arranged over the channel region;
   a storage medium formed on an outer surface of the pillar, and including a plurality of ferroelectric layers individually polarized by different electric fields; and
   a gate arranged on an outer surface of the storage medium,
   wherein the ferroelectric layers comprise a substantially same type of a material having different composition ratios.

14. The semiconductor memory device of claim 13, wherein the ferroelectric layers are stacked.

15. The semiconductor memory device of claim 13, further comprising an insulting layer between the semiconductor substrate and the storage medium.

16. The semiconductor memory device of claim 13, wherein the source has a first impurity type, and the drain and the channel region have a second impurity type opposite to first impurity type.

17. The semiconductor memory device of claim 16, further comprising a junction inducement region including the first impurity type between the drain and the channel region.

18. The semiconductor memory device of claim 13, wherein the gate and the storage medium are configured to surround an entire outer surface of the pillar by one continuous gate electrode and one continuous storage film.

19. The semiconductor memory device of claim 13, wherein the gate and the storage medium are formed on both sidewalls of the pillar.

* * * * *